United States Patent
Dietl et al.

(10) Patent No.: US 9,214,939 B2
(45) Date of Patent: Dec. 15, 2015

(54) ADAPTIVE BUS TERMINATION APPARATUS AND METHODS

(71) Applicant: TEXAS INSTRUMENTS DEUTSCHLAND GmbH, Freising (DE)

(72) Inventors: Markus Dietl, Munich (DE); Sotirios Tambouris, Munich (DE); Siva RaghuRam Prasad Chennupati, Unterschleissheim (DE)

(73) Assignee: TEXAS INSTRUMENTS DEUTSCHLAND GmbH, Freising (DE)

( * ) Notice: Subject to any disclaimer, the term of this patent is extended or adjusted under 35 U.S.C. 154(b) by 0 days.

(21) Appl. No.: 14/328,656

(22) Filed: Jul. 10, 2014

(65) Prior Publication Data
US 2015/0155867 A1 Jun. 4, 2015

Related U.S. Application Data

(60) Provisional application No. 61/910,582, filed on Dec. 2, 2013.

(51) Int. Cl.
*H03K 17/16* (2006.01)
*H03K 19/00* (2006.01)
*G06F 1/10* (2006.01)
*H03K 19/0175* (2006.01)
*G06F 13/40* (2006.01)
(Continued)

(52) U.S. Cl.
CPC .............. *H03K 19/0005* (2013.01); *G06F 1/10* (2013.01); *G06F 13/40* (2013.01); *G06F 13/4086* (2013.01); *H03K 19/0008* (2013.01); *H03K 19/017545* (2013.01); *H04L 25/0278* (2013.01); *H04L 25/0298* (2013.01); *H04L 25/03885* (2013.01)

(58) Field of Classification Search
CPC . G06F 13/4086; G06F 13/16; G06F 13/4072; Y02B 60/1235; G11C 5/04; G11C 7/1072; G11C 7/22; G11C 29/025; H04L 25/0298; H04L 12/40; H04L 25/0278; H04L 25/028; H03K 19/0005; H03K 19/01837; H03K 19/017545; H03K 19/018585; H03K 5/131; H05K 1/0246
USPC ................... 326/30, 86, 38–40; 365/233, 191
See application file for complete search history.

(56) References Cited

U.S. PATENT DOCUMENTS 6,356,106 B1 * 3/2002 Greeff et al. ................... 326/30
6,754,132 B2 * 6/2004 Kyung ........................ 365/233.1

(Continued)

*Primary Examiner* — Vibol Tan
(74) *Attorney, Agent, or Firm* — Andrew Viger; Frank D. Cimino

(57) ABSTRACT

Termination impedance of a digital signal bus is adaptively selected as a function of a present or anticipated state of the bus. A variable termination resistor is arranged in series between a termination switch and a common voltage node at the termination end of each bus conductor. Information regarding the current or anticipated bus state is received from an external device such as a bus controller or may be derived by sensing activity on the bus. For example, clock frequency detection logic coupled to clock lines of the bus senses the current operational speed of the bus. A highest-value termination resistance predetermined to be consistent with reliable bus operation under conditions of the current or anticipated bus state is selected for each bus conductor. A bus conductor termination may be taken to a high impedance state by opening the associated termination switch. Decreased average bus power consumption may result.

19 Claims, 3 Drawing Sheets

(51) Int. Cl.
*H04L 25/02* (2006.01)
*H04L 25/03* (2006.01)

(56) References Cited

U.S. PATENT DOCUMENTS

| | | | |
|---|---|---|---|
| 7,173,450 B2 * | 2/2007 | Atkinson | 326/30 |
| 7,872,495 B1 * | 1/2011 | Tran et al. | 326/30 |
| 7,881,430 B2 * | 2/2011 | Coombs | 378/62 |
| 8,041,865 B2 * | 10/2011 | Bruennert et al. | 710/104 |
| 8,274,850 B2 * | 9/2012 | Koshizuka | 365/191 |
| 8,547,761 B2 * | 10/2013 | Kim et al. | 365/198 |
| 8,576,645 B2 * | 11/2013 | Kim | 365/193 |
| 9,001,597 B2 * | 4/2015 | Koshizuka | 365/191 |
| 2010/0027356 A1 | 2/2010 | Shaeffer et al. | |

\* cited by examiner

ADAPTIVE BUS TERMINATION APPARATUS AND METHODS

PRIORITY CLAIM

This application claims the benefit of priority under 35 U.S.C. §119(e) to U.S. Provisional Patent Application Ser. No. 61/910,582 titled "Low Power-Bus Termination Scheme," filed on Dec. 2, 2013 and incorporated herein by reference in its entirety.

TECHNICAL FIELD

Structures and methods described herein relate to digital signal transmission buses such as computer and microprocessor buses, including impedance termination of such buses to reduce interference caused by reflections of bus signals from the end(s) of the bus back toward bus drivers and receivers.

BACKGROUND INFORMATION

In today's world of portable electronic device computing, digital communication and large server farms, ever-increasing computing speed and decreased power consumption are actively pursued. Complex computing applications, sophisticated communication algorithms, and large server access loading drive the demand for computing speed. User demand for increased time between battery recharge cycles and the large energy requirements of server farms drive the pursuit of decreased power consumption. Advancing the state of the art in computing speed while reducing power consumption is difficult because the two issues are directly related. In general, increasing the clock speed of a given hardware configuration results in higher power consumption.

A primary data bandwidth bottleneck and power consumption portion of current computing devices are the memory channel and other parallel buses used to access addressable devices. Such channels and buses (e.g., communication channels associated with current-art memory technologies such as double data rate ("DDR") synchronous dynamic random-access memory ("SDRAM")) consume a significant amount of power in the termination load associated with each address, control, and clock signal path. The latter termination loads often consist of one or more fixed termination resistors electrically connected at the receiver end of each bus signal path. The termination resistors load the bus at the receiver end to absorb high-speed bus signals that might otherwise be reflected back to receiving devices on the bus. Such reflections can interfere with the coherent reception of the bus signals at the receiving devices.

FIG. 1 is a prior-art schematic diagram of a computer memory bus 105. The computer memory bus 105 is an example of a parallel digital signal bus to which embodiments described herein are applicable. In the case of the example memory bus 105, address and control ("ADD/CTRL") signals are imposed on bus conductors 110 by a memory controller 115. The memory controller 115 also transmits one or more clock signals on bus conductors 120. The clock signals are used to clock address and control words into dynamic random access ("DRAM") devices 125. Addressed data words are transmitted to or retrieved from the DRAM devices 125 on a data ("DQ") bus 130.

Address, control and clock bus conductors are typically each individually terminated at the end 135 of the bus 105 that is furthest from the memory controller 115, at a point past the last bus device (e.g., the DRAM device 140). The end 135 of the bus 105 is referred to herein as the "receiver end" of the bus. Each of the bus conductors 110, 120 is typically terminated with a fixed-value resistor R_TERM (e.g., the resistor R_TERM 145). Each termination resistor R_TERM is connected between the receiver end of the corresponding bus conductor and a common regulated voltage node 150 referred to as the "voltage termination terminal" ("VTT"). The voltage level at the regulated voltage node 150 is maintained by a voltage regulator referred to as the "VTT generator" 160.

The described bus termination provides damping for each of the bus conductors 110, 120 to reduce bus signal reflections from the receiver ends 135 of the bus conductors as previously described. A lower resistance value of a termination resistor associated with a particular bus conductor provides greater damping as may be required for higher bus clocking frequencies. However, a lower resistance value also increases current flow through that bus conductor and overall power consumption, even when no signals are being transmitted on the bus conductor. Termination resistance values are thus typically chosen as compromises between power consumption and reliable bus operation at highest anticipated bus clocking rates.

SUMMARY OF THE INVENTION

Figure 1:
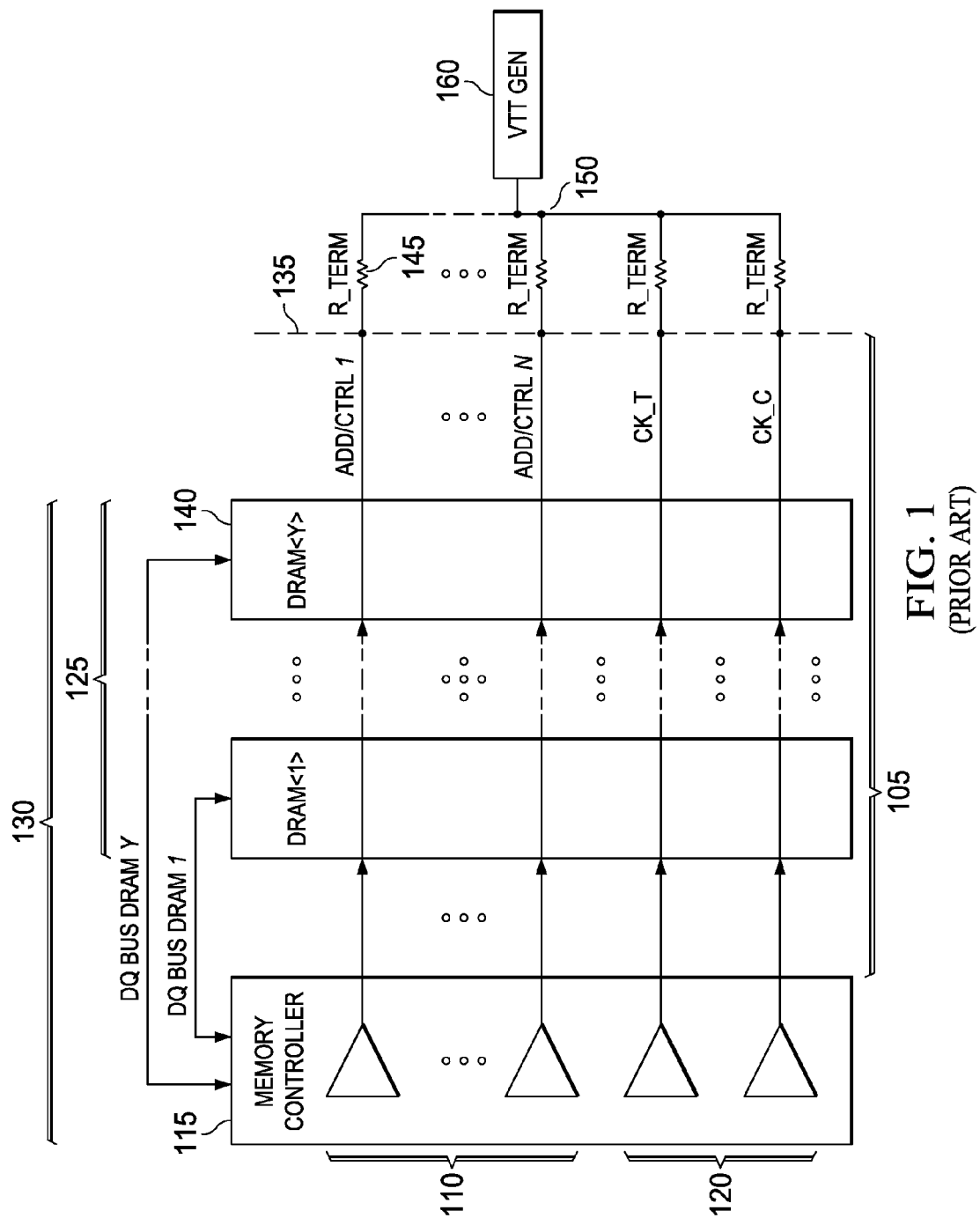
FIG. 1 is a prior-art schematic diagram of a computer memory bus.

Apparatus and methods disclosed herein adaptively select bus termination impedance as a function of a present or anticipated state of a digital signal bus. As used herein, the term "state of the digital signal bus," "state of the bus" and "bus state" shall mean a frequency of a clock signal used to clock bus signals into or out of a device connected to the bus and/or bus signal activity on one or more bus conductors (also referred to herein as "bus lines"). A state of bus signal activity may be associated with a bus sleep state or power-down state. Bus signal states may also be associated with one or more portions of the bus or the entire bus being selected by a bus controller (e.g., a memory controller in the example case of a computer memory bus as described herein). The term "bus state information" shall mean information relating to a bus state. Bus state information may be sent across a communication channel from a controller to some embodiments of the apparatus disclosed herein. In some embodiments, bus state information may be derived by one or more components of the disclosed apparatus and sent to other portions of the disclosed apparatus.

A variable termination resistor is arranged in series between a termination switch and a common voltage node at the termination end of each bus conductor. It is noted that the term "variable termination resistor" as used herein shall mean either a single resistive element whose value may be varied or a group of resistive elements arranged in a series and/or parallel network from which one or more elements may be selected to vary the resistance value of the termination resistor. Embodiments herein select a resistance value and an open or closed state of the termination switch associated with the corresponding bus conductor to control the termination impedance of that bus conductor. A bus conductor termination may be taken to a high impedance state by opening the associated termination switch. With the termination switch in a closed state, termination loading for a particular bus conductor may be increased by selecting a lower-value termination resistor. Doing so may enable the successful transmission and reception of bus signals on that conductor at higher speeds but also increases current flow through the conductor and increases power consumption. Thus, embodiments herein enable tuning of a digital signal bus for lowest power consumption consistent with reliable bus operation.

Some embodiments process current or anticipated bus state information to make bus conductor termination impedance decisions. The bus state information may be sent to the disclosed apparatus by a device external to the disclosed apparatus such as a bus controller. The bus state information may be sent across one or more lines of the bus to be terminated or across a special-purpose termination bus linking the controller to the disclosed apparatus. Alternatively or additionally, some embodiments may act upon bus state information sensed directly from the digital signal bus by the disclosed apparatus. For example, some embodiments may include clock frequency detection logic coupled to clock lines of the bus. The clock frequency detection logic may sense the current operational speed of the bus and send such bus state information to other logic within the disclosed apparatus to use in making bus termination impedance decisions. Alternatively or additionally, some embodiments may simply act upon commands to set particular termination resistances for one or more bus conductors. Such commands may be received from a device external to the disclosed apparatus, such as a bus controller, or may be internally generated by a bus state sensing device such as the afore-mentioned clock frequency detection logic.

DETAILED DESCRIPTION

Figure 2:
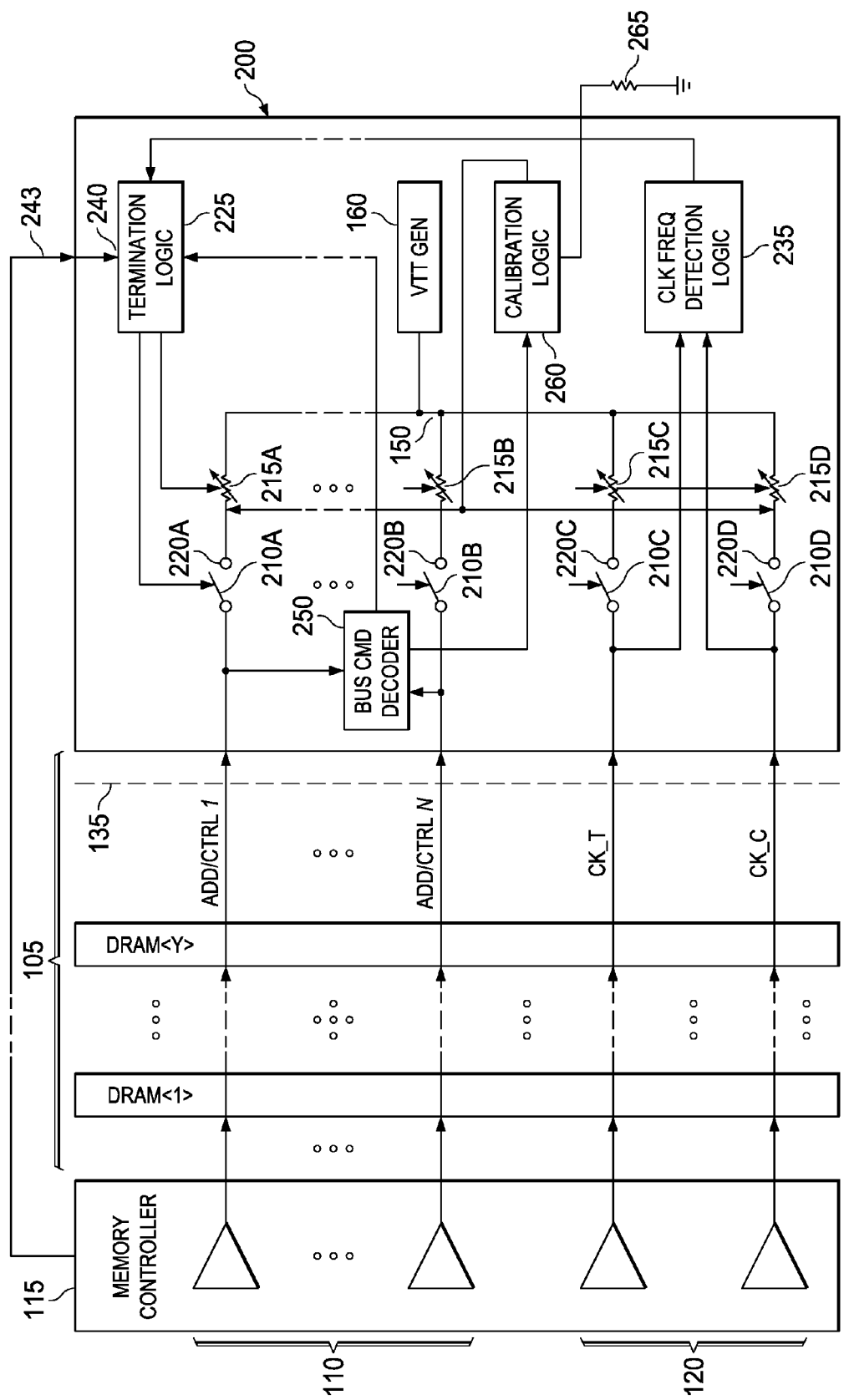
FIG. 2 is a schematic diagram of an adaptive digital bus termination apparatus according to various example embodiments of the invention, the bus termination apparatus shown in relation to an example digital memory bus.

FIG. 2 is a schematic diagram of an adaptive digital bus termination apparatus 200 according to various example embodiments of the invention. The bus termination apparatus 200 is shown in relation to an example digital memory (DRAM) bus 105 as previously described. It is noted, however, that structures and methods described herein apply to many types of digital signal buses and that a DRAM bus is merely an example of a digital signal bus. Accordingly, the terms "DRAM bus 105," "digital memory bus 105," and "digital signal bus 105" are used interchangeably herein.

The adaptive bus termination apparatus 200 includes a plurality of termination switches 210 (e.g., the switches 210A, 210B, 210C, and 210D). Each termination switch 210 is to be singly coupled in series with a bus signal conductor (e.g., with each of the ADD/CTRL signal conductors 110 and with each of the bus clock signal conductors 120). Each termination switch 210 is coupled to a corresponding bus conductor at a receiver end 135 furthest from a driver end of the digital signal bus 105. Each termination switch 210 is configured to leave the corresponding bus signal conductor electrically open at the receiver end 135 of the bus 105 when the termination switch 210 is open.

The adaptive bus termination apparatus 200 also includes a plurality of variable termination resistors 215 (e.g., the variable termination resistors 215A, 215B, 215C, and 215D). Each variable termination resistor 215 is coupled in series between a termination terminal 220 (e.g., the termination terminals 220A, 220B, 220C, and 220D) of a corresponding termination switch 210 and a common voltage node 150. The termination terminal 220 of the termination switch 210 is electrically connected to the receiver end 135 of the bus 105 only when the termination switch 210 is closed. It is noted that each variable termination resistor 215 may consist of a switched serial and/or parallel combination of a plurality of fixed-value resistors.

The adaptive bus termination apparatus 200 further includes a termination logic module 225 coupled to the plurality of termination switches 210 and to the plurality of variable termination resistors 215. The termination logic module 225 receives bus state information and/or one or more bus termination commands as described below. The termination logic module 225 uses the bus state information and/or the bus termination commands to select a termination resistance for each bus signal conductor 110, 120. The module 225 selects the highest termination resistance for each bus signal conductor 110, 120 predetermined to be consistent with reliable operation of the digital signal bus 105 for a bus state indicated by the bus state information or the bus termination commands. A bus conductor termination resistance is selected by setting a state of each termination switch 210 and a value of each variable termination resistor 215.

In some embodiments, the adaptive bus termination apparatus 200 also includes a VTT generator 160 coupled to the common voltage node 150. The VTT generator 150 is a voltage regulator and maintains a constant voltage level at the common voltage node 150.

The adaptive digital signal bus termination apparatus 200 also includes clock frequency detection logic 235 coupled to the termination logic module 225. The clock frequency detection logic 235 is to be coupled to one or more of the bus clock signal conductors 120. The clock frequency detection logic 235 receives one or more bus clock signals, senses a frequency of the bus clock signal(s), and outputs an indication of the present frequency of operation of the digital signal bus 105 or a portion thereof to the termination logic module as the bus state information.

The adaptive digital signal bus termination apparatus 200 further includes one or more termination control bus input terminal(s) 240 associated with the termination logic module 225. The termination control bus input terminals 240 are to couple to a termination control bus 243. The input terminals 240 receive the bus state information or the bus termination command from a controller 115 at the driver end 135 of the digital signal bus 105. The bus state information and/or termination impedance commands are transferred across the termination control bus 243 and are used by the termination logic module 225 to set a state of each termination switch 210 and a resistance value of each variable termination resistor 215.

The adaptive digital signal bus termination apparatus 200 also includes a bus command decoder 250 coupled to the termination logic module 225. The bus command decoder 250 is also to be coupled to a portion of the digital signal bus 105 or to the entirety thereof. The bus command decoder 250 receives bus state information, one or more bus termination commands, and/or one or more termination resistor calibration commands. The bus state information and/or commands are transmitted across the digital signal bus 105 from a controller 115 configured at the driver end of the digital signal bus 105. The bus command decoder 250 passes the bus state information and/or the bus termination commands to the termination logic module 225.

Some embodiments of the adaptive digital signal bus termination apparatus 200 also include a calibration logic module 260 coupled to the bus command decoder 250 and to each of the variable termination resistors 215. The calibration logic module 260 receives termination resistor calibration commands from the controller 115. The calibration logic module 260 compares resistances values of the variable termination resistors 215 to a resistance value of a precision calibration resistor 265 configured externally to the adaptive digital signal bus termination apparatus 200. The calibration logic module 260 calibrates the resistance values of the variable termination resistors 215 to adjust for temperature, voltage, and/or process induced variations of the resistance values of the variable termination resistors 215 from design values.

It is noted that some embodiments of the adaptive digital signal bus termination apparatus 200 may include the elements applicable to a particular embodiment such as the termination switches 210, the variable termination resistors 215, the termination logic module 225, the clock frequency detection logic 235, the termination control bus input terminal 240, the bus command decoder 250, the calibration logic 260, and the VTT generator 160 in a single integrated circuit package.

Figure 3:
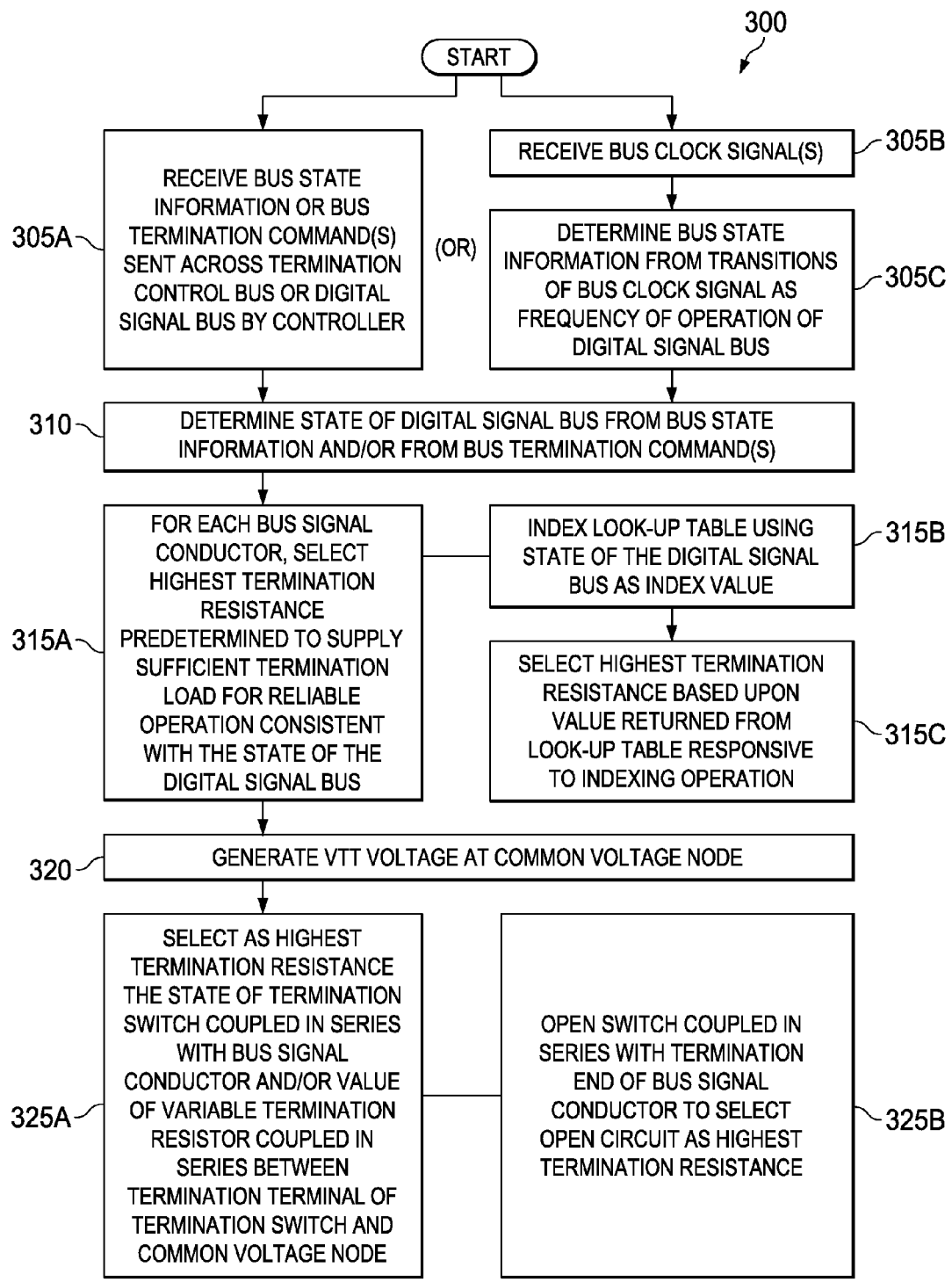
FIG. 3 is a flow diagram illustrating an example method of adaptive impedance termination of a digital signal bus by an electronic circuit according to various example activities.

FIG. 3 is a flow diagram illustrating an example method 300 of adaptive impedance termination of a digital signal bus by an electronic circuit according to various example activities. The method 300 includes receiving bus state information or a bus termination command, determining the state of the digital signal bus, and selecting an appropriate bus termination resistance for each bus conductor as further described in detail below. The "state of the digital signal bus" means a frequency of clock signals used to clock address and control signals into at least one receiving device coupled to the digital signal bus or bus signal activity on one or more of the bus signal conductors, as previously defined. Examples of bus states include an active bus state associated with data being transmitted across the digital signal bus, a deselected bus state during which no data is transmitted across the digital signal bus while address and control bus signal conductors are actively driven, and a power-down bus state.

The method 300 commences at block 305A with receiving bus state information, one or more bus termination commands, or both, from a controller configured at the driver end of the digital signal bus. The bus state information and/or bus termination commands may be sent by the controller across the digital signal bus itself or across a specialized termination control bus. Alternatively or additionally, the method 300 may include receiving bus clock signals, at block 305B. The method 300 may also include determining bus state information as the frequency of operation of one or more portions of the digital signal bus from transitions of the bus clock signals, at block 305C.

The method 300 continues at block 310 with determining a state of the digital signal bus from the bus state information and/or from the bus termination commands. For each of a plurality of bus signal conductors associated with the digital signal bus, the method 300 includes choosing a highest termination resistance predetermined to supply sufficient termination load to the bus signal conductor for reliable operation of the digital signal bus consistent with the state of the digital signal bus, at block 315A. Some variations of the method 300 may include indexing a look-up table using the state of the digital signal bus as an index value, at block 315B. The method 300 may also include choosing the highest termination resistance based upon a value returned from the look-up table in response to the indexing operation, at block 315C.

The method 300 continues at block 320 with generating a regulated VTT voltage at a common voltage node. The method 300 includes selecting a state of a termination switch singly coupled in series with the bus signal conductor at a receiver end of the digital signal bus, selecting a value of a variable termination resistor coupled in series between a termination terminal of the termination switch and a common voltage node, or both to select the highest termination resistance, at block 325A. The method 300 also includes opening a switch coupled in series with the termination end of the bus signal conductor to select an open circuit as the highest termination resistance, at block 325B.

Apparatus and methods described herein may be useful in applications other than adaptive digital signal bus impedance termination. The apparatus 200 and the method 300 are intended to provide a general understanding of the sequences of various methods and the structures of various embodiments. They are not intended to serve as complete descriptions of all elements and features of methods, apparatus and systems that might make use of these example sequences and structures.

The various embodiments may be incorporated into semiconductor analog and digital circuits for use in receptacle power converters, electronic circuitry used in computers, communication and signal processing circuitry, single-processor or multi-processor modules, single or multiple embedded processors, multi-core processors, data switches, and application-specific modules including multi-layer, multi-chip modules, among others. Such apparatus and systems may further be included as sub-components within a variety of electronic systems such as robotics, medical devices (e.g., heart monitor, blood pressure monitor, etc.), motor vehicles, televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), set top boxes, household appliances and others.

Methods and structures disclosed herein act upon derived or externally received digital signal bus state information by adaptively selecting, for each bus conductor, a highest termination resistance predetermined to be consistent with reliable bus operation of a digital signal bus in a particular state as determined from the received bus state information. Power is conserved by increasing bus conductor termination resistance and thus decreasing bus conductor current at times when bus operation frequencies are decreased, one or more portions of the bus are quiesced, etc. Portable electronic device users may experience increased time between battery charges as a result. Operators of large server farms may incur lower energy costs.

By way of illustration and not of limitation, the accompanying figures show specific aspects in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction. The aspects illustrated are described in sufficient detail to enable those skilled in the art to practice the teachings disclosed herein. Other aspects may be used and derived therefrom, such that structural and logical substitutions and changes may be made without departing from the scope of this disclosure. This Detailed Description, therefore, is not to be taken in a limiting sense. The breadth of various aspects is defined by the appended claims and the full range of equivalents to which such claims are entitled.

Such aspects of the inventive subject matter may be referred to herein individually or collectively by the term "invention" merely for convenience and without intending to voluntarily limit this application to any single invention or inventive concept, if more than one is in fact disclosed. Thus, although specific aspects have been illustrated and described herein, any arrangement calculated to achieve the same purpose may be substituted for the specific aspects shown. This disclosure is intended to cover any and all adaptations or variations of various aspects.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the preceding Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. The following claims are hereby incorporated into the Detailed Description, with each claim standing on its own as a separate embodiment.

What is claimed is:

1. An adaptive digital signal bus termination apparatus, comprising:
    a plurality of termination switches, each termination switch to be singly coupled in series with a bus signal conductor at a receiver end of a digital signal bus furthest from a driver end of the digital signal bus, the termination switch configured to leave the bus signal conductor electrically open at the receiver end of the bus when the termination switch is open;
    a plurality of variable termination resistors, each variable termination resistor coupled in series between a termination terminal of a corresponding termination switch and a common voltage node, the termination terminal of the termination switch electrically connected to the receiver end of the bus only when the termination switch is closed; and
    a termination logic module coupled to the plurality of termination switches and to the plurality of variable termination resistors to receive at least one of bus state information or at least one bus termination command and to select a highest termination resistance for each bus signal conductor predetermined to be consistent with reliable operation of the digital signal bus for a bus state indicated by the bus state information or the bus termination command by setting a state of each termination switch and a value of each variable termination resistor.

2. The adaptive digital signal bus termination apparatus of claim 1, further comprising:
    a voltage termination terminal ("VTT") generator comprising a voltage regulator coupled to the common voltage node to supply a constant voltage level at the common voltage node.

3. The adaptive digital signal bus termination apparatus of claim 1, the digital signal bus being a dynamic random access memory ("DRAM") bus.

4. The adaptive digital signal bus termination apparatus of claim 3, the bus signal conductor selected from a group consisting of an address signal conductor, a control signal conductor, and a clock signal conductor.

5. The adaptive digital signal bus termination apparatus of claim 1, each variable termination resistor further comprising:
    a switched serial and/or parallel combination of a plurality of fixed-value resistors.

6. The adaptive digital signal bus termination apparatus of claim 1, further comprising:
    clock frequency detection logic coupled to the termination logic module and to be coupled to at least one bus clock signal conductor to receive at least one bus clock signal, to sense a frequency of the bus clock signal and to output an indication of the present frequency of operation of at least a portion of the digital signal bus to the termination logic module as the bus state information.

7. The adaptive digital signal bus termination apparatus of claim 1, further comprising:
    at least one termination control bus input terminal associated with the termination logic module to couple to a termination control bus and to receive the bus state information or the bus termination command from a controller at the driver end of the digital signal bus, the bus state information or termination impedance command to be transferred across the termination control bus and to be used by the termination logic module to set a state of each termination switch and a resistance value of each variable termination resistor.

8. The adaptive digital signal bus termination apparatus of claim 1, further comprising:
    a bus command decoder coupled to the termination logic module and to be coupled to at least a portion of the digital signal bus to receive at least one of the bus state information, the bus termination command, or at least one termination resistor calibration command across the portion of the digital signal bus from a controller configured at the driver end of the digital signal bus and to pass the bus state information or the bus termination command to the termination logic module.

9. The adaptive digital signal bus termination apparatus of claim 8, further comprising:
    a calibration logic module coupled to the bus command decoder and to each of the variable termination resistors to receive the termination resistor calibration commands from the controller, to compare resistances values of the variable termination resistors to a resistance value of a precision calibration resistor configured externally to the adaptive digital signal bus termination apparatus, and to calibrate the resistance values of the variable termination resistors to adjust for temperature, voltage, and/or process induced variations of the resistance values of the variable termination resistors from design values.

10. An adaptive digital signal bus termination apparatus, comprising:
    a plurality of termination switches, each termination switch to be singly coupled in series with a bus signal conductor at a receiver end of a digital signal bus furthest from a driver end of the digital signal bus, the termination switch configured to leave the bus signal conductor electrically open at the receiver end of the bus when the termination switch is open;
    a plurality of variable termination resistors, each variable termination resistor coupled in series between a termination terminal of a corresponding termination switch and a common voltage node, the termination terminal of the termination switch electrically connected to the receiver end of the bus only when the termination switch is closed;
    a termination logic module coupled to the plurality of termination switches and to the plurality of variable termination resistors to receive at least one of bus state information or at least one bus termination command and to select a highest termination resistance for each bus signal conductor predetermined to be consistent with reliable operation of the digital signal bus for a bus state indicated by the bus state information or the bus termination command by setting a state of each termination switch and a value of each variable termination resistor;

at least one termination control bus input terminal associated with the termination logic module to couple to a termination control bus and to receive the bus state information or the bus termination command from a controller at the driver end of the digital signal bus, the bus state information or termination impedance command to be transferred across the termination control bus and to be used by the termination logic module to set a state of each termination switch and a resistance value of each variable termination resistor; and a bus command decoder coupled to the termination logic module and to be coupled to at least a portion of the digital signal bus to receive at least one of the bus state information, the bus termination command, or at least one termination resistor calibration command sent across the portion of the digital signal bus by a controller configured at the driver end of the digital signal bus, the bus command decoder to pass the bus state information or the bus termination command to the termination logic module.

11. The adaptive digital signal bus termination apparatus of claim 10, the plurality of termination switches, the plurality of variable termination resistors, the termination logic module, the termination control bus input terminal, and the bus command decoder incorporated into a single integrated circuit package.

12. A method of adaptive impedance termination of a digital signal bus by an electronic circuit, comprising:

receiving at least one of bus state information or at least one bus termination command;

determining a state of the digital signal bus from the bus state information or the bus termination commands; and for each of a plurality of bus signal conductors associated with the digital signal bus, choosing a highest termination resistance predetermined to supply sufficient termination load to the bus signal conductor for reliable operation of the digital signal bus consistent with the state of the digital signal bus, the state of the digital signal bus selected from a group consisting of an active bus state associated with data being transmitted across the digital signal bus, a deselected bus state during which no data is transmitted across the digital signal bus while address and control bus signal conductors are actively driven, and a power-down bus state.

13. The method of adaptive impedance termination of a digital signal bus by an electronic circuit of claim 12, the state of the digital signal bus being at least one of a frequency of clock signals used to clock address and control signals into at least one receiving device coupled to the digital signal bus or bus signal activity on one or more of the bus signal conductors.

14. The method of adaptive impedance termination of a digital signal bus by an electronic circuit of claim 12, further comprising:

opening a switch coupled in series with the termination end of the bus signal conductor to select an open circuit as the highest termination resistance.

15. The method of adaptive impedance termination of a digital signal bus by an electronic circuit of claim 12, further comprising:

indexing a look-up table using the state of the digital signal bus as an index value; and choosing the highest termination resistance based upon a value returned from the look-up table in response to the indexing operation.

16. The method of adaptive impedance termination of a digital signal bus by an electronic circuit of claim 12, further comprising:

receiving at least one of the bus state information or the bus termination commands sent by a controller across a termination control bus, the controller configured at a driver end of the digital signal bus; and selecting at least one of a state of a termination switch singly coupled in series with the bus signal conductor at a receiver end of the digital signal bus or a value of a variable termination resistor coupled in series between a termination terminal of the termination switch and a common voltage node to select the highest termination resistance.

17. The method of adaptive impedance termination of a digital signal bus by an electronic circuit of claim 16, further comprising:

generating a regulated voltage termination terminal ("VTT") voltage at the common voltage node.

18. The method of adaptive impedance termination of a digital signal bus by an electronic circuit of claim 12, further comprising:

receiving at least one of the bus state information or the bus termination commands sent by a controller across the digital signal bus, the controller configured at a driver end of the digital signal bus; and selecting at least one of a state of a termination switch singly coupled in series with the bus signal conductor at a receiver end of the digital signal bus or a value of a variable termination resistor coupled in series between a termination terminal of the termination switch and a common voltage node to select the highest termination resistance.

19. The method of adaptive impedance termination of a digital signal bus by an electronic circuit of claim 12, further comprising:

receiving at least one bus clock signal;

from transitions of the bus clock signal, determining the bus state information as a frequency of operation of at least a portion of the digital signal bus; and selecting at least one of a state of a termination switch singly coupled in series with the bus signal conductor at a receiver end of the digital signal bus or a value of a variable termination resistor coupled in series between a termination terminal of the termination switch and a common voltage node to select the highest termination resistance.

* * * * *